United States Patent
Mathijssen et al.

(10) Patent No.: US 12,474,642 B2
(45) Date of Patent: Nov. 18, 2025

(54) METROLOGY METHOD FOR MEASURING AN ETCHED TRENCH AND ASSOCIATED METROLOGY APPARATUS

(71) Applicant: ASML Netherlands B.V., Veldhoven (NL)

(72) Inventors: Simon Gijsbert Josephus Mathijssen, Rosmalen (NL); Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 150 days.

(21) Appl. No.: 18/255,310

(22) PCT Filed: Dec. 8, 2021

(86) PCT No.: PCT/EP2021/084830
§ 371 (c)(1),
(2) Date: May 31, 2023

(87) PCT Pub. No.: WO2022/128688
PCT Pub. Date: Jun. 23, 2022

(65) Prior Publication Data
US 2024/0012339 A1  Jan. 11, 2024

(30) Foreign Application Priority Data

Dec. 18, 2020  (EP) .................................. 20215422

(51) Int. Cl.
*G03F 7/00* (2006.01)
(52) U.S. Cl.
CPC ...... *G03F 7/70625* (2013.01); *G03F 7/70633* (2013.01); *G03F 7/70683* (2013.01)

(58) Field of Classification Search
CPC ............. G03F 7/70625; G03F 7/70633; G03F 7/70683; H01L 22/12
See application file for complete search history.

(56) References Cited

U.S. PATENT DOCUMENTS

| | | |
|---|---|---|
| 2006/0033921 A1 | 2/2006 | Den Boef et al. |
| 2006/0066855 A1 | 3/2006 | Boef et al. |

(Continued)

FOREIGN PATENT DOCUMENTS

| | | |
|---|---|---|
| WO | WO 2009/078708 A1 | 6/2009 |
| WO | WO 2009/106279 A1 | 9/2009 |

(Continued)

OTHER PUBLICATIONS

International Search Report and Written Opinion of the International Searching Authority directed to International Patent Application No. PCT/EP2021/084830, mailed May 9, 2022; 10 pages.

(Continued)

*Primary Examiner* — Peter B Kim
(74) *Attorney, Agent, or Firm* — Sterne, Kessler, Goldstein & Fox P.L.L.C.

(57) ABSTRACT

Disclosed is method of determining at least one homogeneity metric describing homogeneity of an etched trench on a substrate formed by a lithographic manufacturing process. The method comprises obtaining one or more images of the etched trench, wherein each of said one or more images comprises a spatial representation of one or more parameters of scattered radiation as detected by a detector or camera following scattering and/or diffraction from the etched trench; and measuring homogeneity along the length of the etched trench on said one or more images to determine said at least one homogeneity metric.

15 Claims, 6 Drawing Sheets

(56) References Cited

U.S. PATENT DOCUMENTS

| | | | |
|---|---|---|---|
| 2007/0273852 A1* | 11/2007 | Arai | G03F 7/70575 355/44 |
| 2009/0316125 A1* | 12/2009 | Finders | G03F 7/70191 355/53 |
| 2010/0201963 A1 | 8/2010 | Cramer et al. | |
| 2011/0027704 A1 | 2/2011 | Cramer et al. | |
| 2011/0043791 A1 | 2/2011 | Smilde et al. | |
| 2011/0102753 A1 | 5/2011 | Van De Kerkhof et al. | |
| 2012/0044470 A1 | 2/2012 | Smilde et al. | |
| 2012/0123581 A1* | 5/2012 | Smilde | G03F 7/70483 706/12 |
| 2013/0258310 A1 | 10/2013 | Smilde et al. | |
| 2013/0271740 A1 | 10/2013 | Quintanilha | |
| 2015/0177166 A1* | 6/2015 | Cramer | H01J 37/26 250/307 |
| 2017/0287751 A1 | 10/2017 | Kuznetsov et al. | |
| 2018/0238814 A1 | 8/2018 | Sapiens et al. | |
| 2018/0275524 A1* | 9/2018 | Den Boef | G03F 7/70625 |
| 2019/0094721 A1 | 3/2019 | Tinnemans et al. | |
| 2020/0124983 A1* | 4/2020 | Badr | G03F 7/70616 |

FOREIGN PATENT DOCUMENTS

| | | |
|---|---|---|
| WO | WO 2013/178422 A1 | 12/2013 |
| WO | WO 2014/082938 A1 | 6/2014 |
| WO | WO 2015/113724 A1 | 8/2015 |
| WO | WO 2017/186483 A1 | 11/2017 |
| WO | WO 2020/020759 A1 | 1/2020 |
| WO | WO 2020/057900 A1 | 3/2020 |

OTHER PUBLICATIONS

International Preliminary Report on Patentability directed to International Patent Application No. PCT/EP2021/084830, issued Jun. 13, 2023; 7 pages.

* cited by examiner

METROLOGY METHOD FOR MEASURING AN ETCHED TRENCH AND ASSOCIATED METROLOGY APPARATUS

CROSS-REFERENCE TO RELATED APPLICATIONS

This application claims priority of EP application 20215422.5 which was filed on Dec. 18, 2020 and which is incorporated herein in its entirety by reference.

FIELD OF THE INVENTION

The present invention relates to methods and apparatus usable, for example, in the manufacture of devices by lithographic techniques, and to methods of manufacturing devices using lithographic techniques. The invention relates more particularly to metrology methods for measuring such devices as part of process control.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

In other applications, metrology sensors are used for measuring exposed structures on a substrate (either in resist and/or after etch). A fast and non-invasive form of specialized inspection tool is a scatterometer in which a beam of radiation is directed onto a target on the surface of the substrate and properties of the scattered or reflected beam are measured. Examples of known scatterometers include angle-resolved scatterometers of the type described in US2006033921A1 and US2010201963A1. In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

For some types of device, such as 3D NAND for example, thick stacks are formed, into which it is required to etch deep trenches (deep etch techniques), e.g., isolation trenches with a high aspect ratio. A problem with these trenches is that, after the etch process, any non-uniformities in the trench can negatively affect their function. It is desirable to improve monitoring of the formation of such trenches.

SUMMARY OF THE INVENTION

The invention in a first aspect provides a method of determining at least one homogeneity metric describing homogeneity of an etched trench on a substrate formed by a lithographic manufacturing process, the method comprising: obtaining one or more images of the etched trench, wherein each of said one or more images comprises a spatial representation of one or more parameters of scattered radiation as detected by a detector or camera following scattering and/or diffraction from the etched trench; and measuring homogeneity along the length of the etched trench on said one or more images to determine said at least one homogeneity metric.

Also disclosed is a computer program, processing device metrology apparatus and a lithographic apparatus comprising a metrology device being operable to perform the method of the first aspect.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Before describing embodiments of the invention in detail, it is instructive to present an example environment in which embodiments of the present invention may be implemented.

Figure 1:
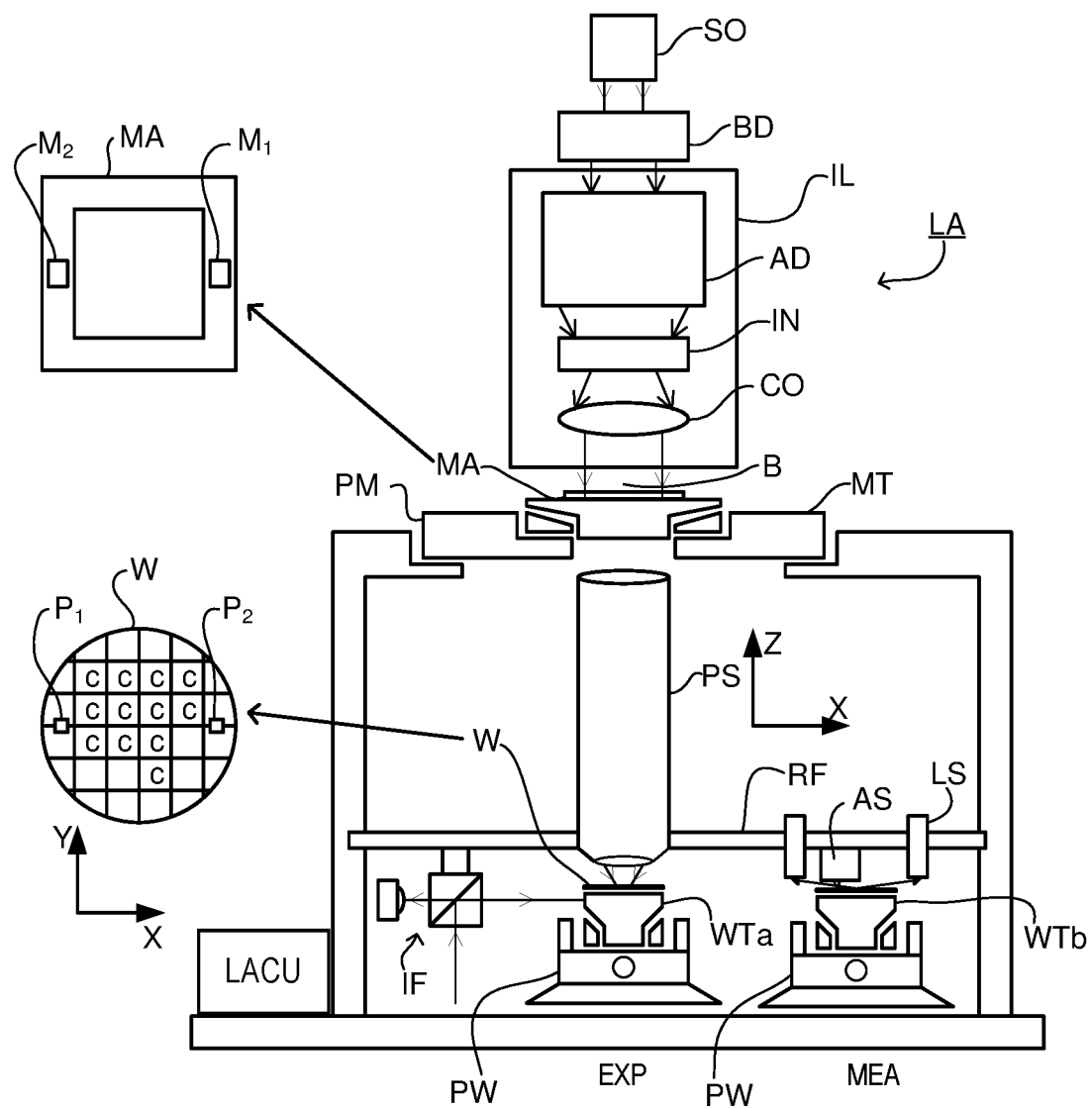
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
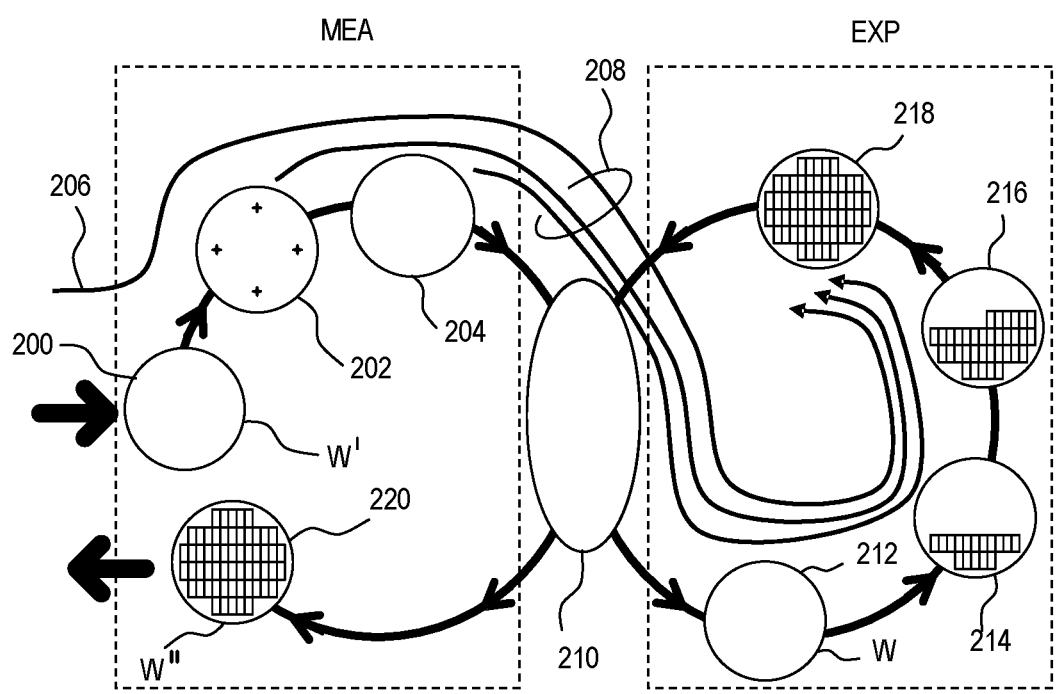
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

One example of a metrology apparatus suitable for metrology in a lithographic monitoring context is a scatterometer. Scatterometers may comprise dark-field scatterometers (where the zeroth order is blocked before the detector such that only diffracted higher orders are captured) and bright-field scatterometers which also capture the zeroth order. Some scatterometers are capable of both bright-field and dark-field metrology. A known type of dark-field scatterometry technique compares the intensity of each of a pair of complementary higher diffraction orders (e.g., compares the respective intensities of the +1 and −1 orders) to determine asymmetry in the measured target (the magnitude of the intensity difference scales with the asymmetry. The target asymmetry can in turn be used to determine various parameters of interest such as overlay or the focus setting when the target was formed.

Figure 3A:
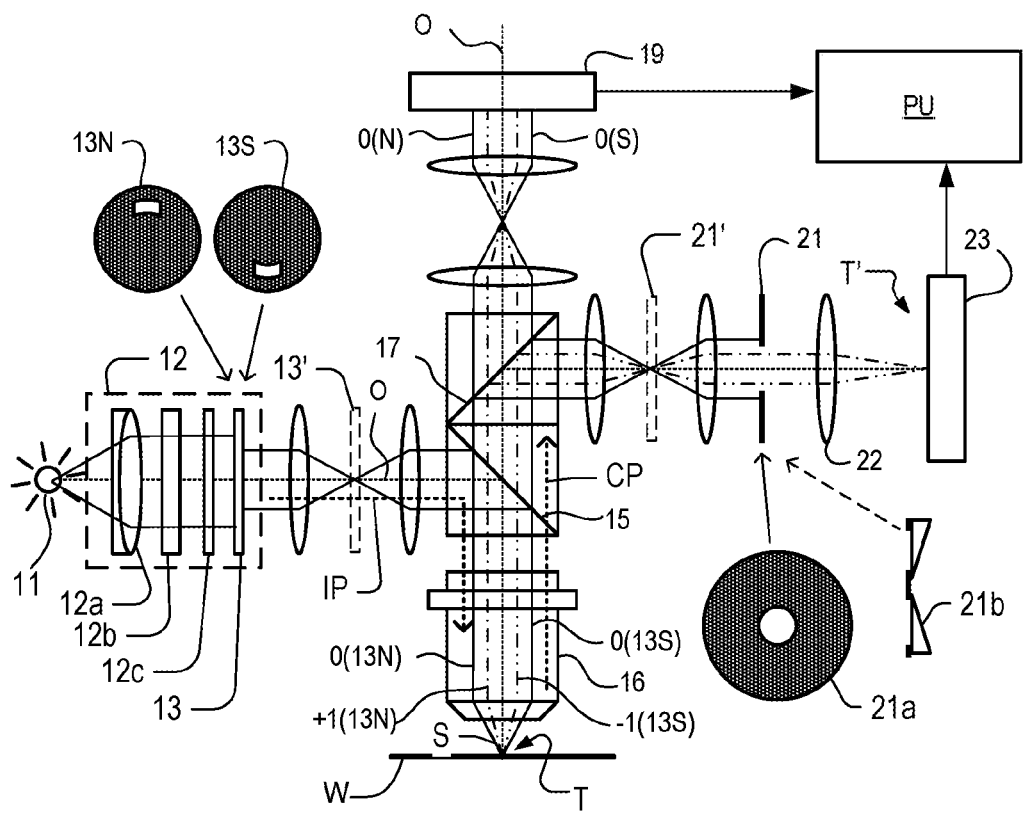
FIGS. 3A and 3B illustrate schematically an inspection apparatus adapted to perform angle-resolved scatterometry and dark-field imaging inspection methods according to an embodiment of the invention.
Figure 3B:
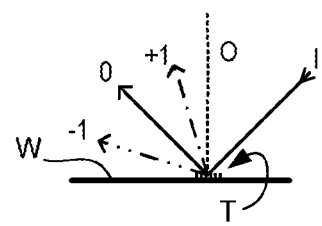

A metrology apparatus suitable for use in embodiments of the invention is shown in FIG. 3(*a*). Note that this is only one example of a suitable metrology apparatus. An alternative suitable metrology apparatus may use EUV radiation such as, for example, that disclosed in WO2017/186483A1. A target structure T and diffracted rays of measurement radiation used to illuminate the target structure are illustrated in more detail in FIG. 3(*b*). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lens arrangement 12 (comprising lenses 12*a*, 12*b*, 12*c*) and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(*b*), target structure T is placed with substrate W normal to the optical axis O of objective lens 16. The substrate W may be supported by a support (not shown). A ray of measurement radiation I impinging on target structure T from an angle off the axis O gives rise to a zeroth order ray (solid line 0) and two first order rays (dot-chain line +1 and double dot-chain line −1), hereafter referred to as a pair of complementary diffraction orders. It should be noted that the pair of complementary diffraction orders may be any higher order pair; e.g., the +2, −2 pair etc. and is not limited to the first order complementary pair. It should be remembered that with an overfilled small target structure, these rays are just one of many parallel rays covering the area of the substrate including metrology target structure T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the target structures and the illumination angles can be designed or adjusted so that the first order rays entering the objective lens are closely aligned with the central optical axis. The rays illustrated in FIGS. 3(*a*) and 3(*b*) are shown somewhat off axis, purely to enable them to be more easily distinguished in the diagram.

At least the 0 and +1 orders diffracted by the target structure T on substrate W are collected by objective lens 16 and directed back through beam splitter 15. Returning to FIG. 3(*a*), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image or angle resolved image) of the target structure on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes, which include, for example pupil reconstruction or metrology based on asymmetry in the pupil plane image.

In the second measurement branch, optical system 20, 22 forms an image of the target structure T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. This may comprise a simple aperture 21*a* or a wedge arrangement 21*b*, the latter enabling simultaneous imaging of the +1 and −1 diffraction orders. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

A specific type of metrology sensor is described in PCT patent application WO 2020/057900 A1, which is incorporated herein by reference. This describes a metrology device with optimized coherence. More specifically, the metrology device is configured to produce a plurality of spatially incoherent beams of measurement illumination, each of said beams (or both beams of measurement pairs of said beams, each measurement pair corresponding to a measurement direction) having corresponding regions within their cross-section for which the phase relationship between the beams at these regions is known; i.e., there is mutual spatial coherence for the corresponding regions.

Such a metrology device is able to measure small pitch targets with acceptable (minimal) interference artifacts (speckle) and will also be operable in a dark-field mode. Such a metrology device may be used as a position or alignment sensor for measuring substrate position (e.g., measuring the position of a periodic structure or alignment mark with respect to a fixed reference position). However, the metrology device is also usable for measurement of overlay (e.g., measurement of relative position of periodic structures in different layers, or even the same layer in the case of stitching marks). The metrology device is also able to measure asymmetry in periodic structures, and therefore could be used to measure any parameter which is based on a target asymmetry measurement (e.g., overlay using diffraction based overlay (DBO) techniques or focus using diffraction based focus (DBF) techniques).

Figure 4:
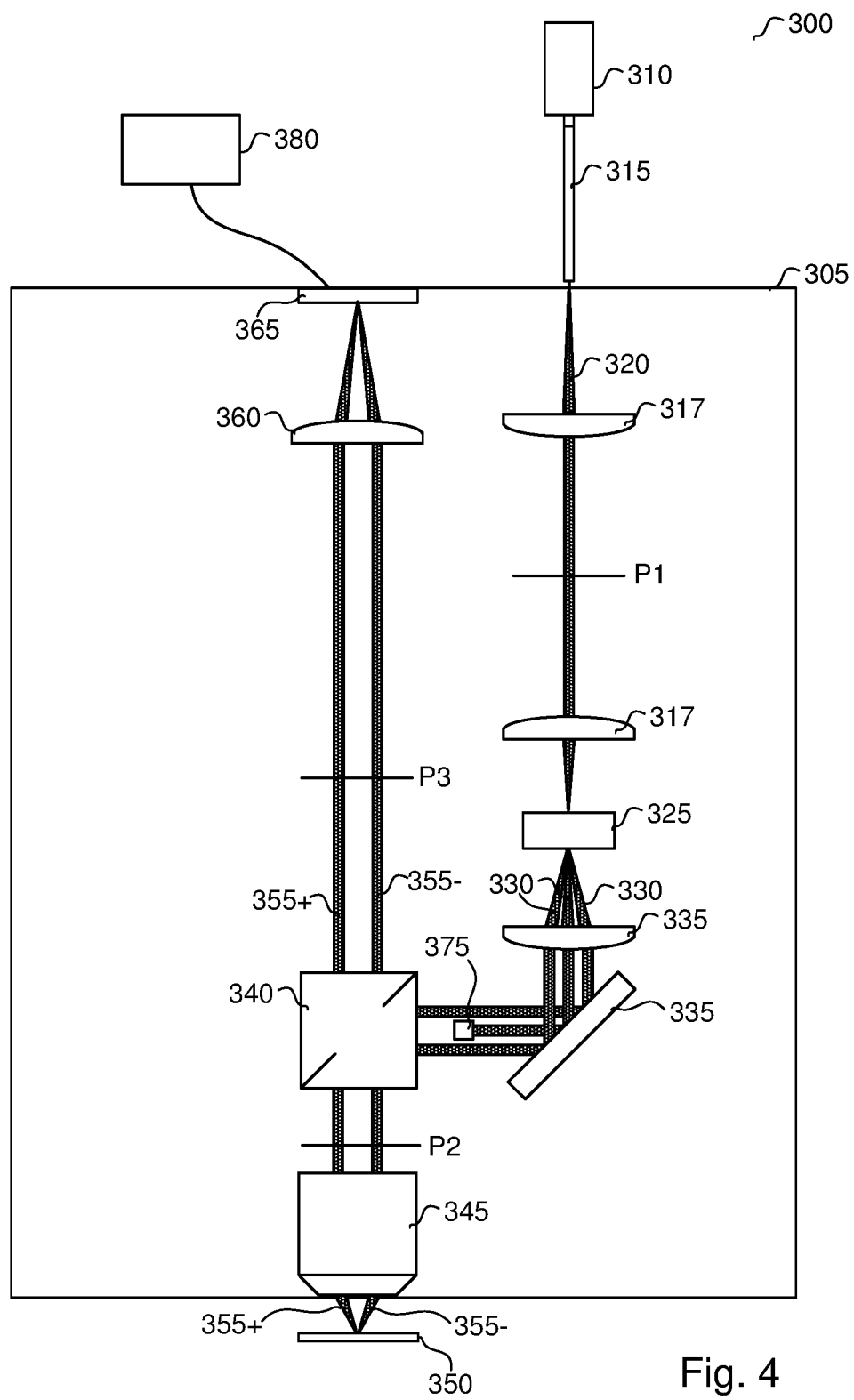
FIG. 4 is a schematic illustration of an example metrology device usable to perform methods according to an embodiment of the invention.

FIG. 4 shows a possible implementation of such a metrology device. The metrology device essentially operates as a standard microscope with a novel illumination mode. The metrology device 300 comprises an optical module 305 comprising the main components of the device. An illumination source 310 (which may be located outside the module 305 and optically coupled thereto by a multimode fiber 315) provides a spatially incoherent radiation beam 320 to the optical module 305. Optical components 317 deliver the spatially incoherent radiation beam 320 to a coherent off-axis illumination generator 325. The coherent off-axis illumination generator 325 generates a plurality (e.g., four) off-axis beams 330 from the spatially incoherent radiation beam 320. The zeroth order of the illumination generator may be blocked by an illumination zero order block element 375. This zeroth order will only be present for some of the coherent off-axis illumination generator examples described in this document (e.g., phase grating based illumination generators), and therefore may be omitted when such zeroth order illumination is not generated. The off-axis beams 330 are delivered (via optical components 335 and) a spot mirror 340 to an (e.g., high NA) objective lens 345. The objective lens focusses the off-axis beams 330 onto a sample (e.g., periodic structure/alignment mark) located on a substrate 350, where they scatter and diffract. The scattered higher diffraction orders 355+, 355− (e.g., +1 and −1 orders respectively), propagate back via the spot mirror 340, and are focused by optical component 360 onto a sensor or camera 365 where they interfere to form an interference pattern. A processor 380 running suitable software can then process the image(s) of the interference pattern captured by camera 365.

The zeroth order diffracted (specularly reflected) radiation is blocked at a suitable location in the detection branch; e.g., by the spot mirror 340 and/or a separate detection zero-order block element. It should be noted that there is a zeroth order reflection for each of the off-axis illumination beams, i.e. in the current embodiment there are four of these zeroth order reflections in total. As such, the metrology device operated as a "dark field" metrology device.

A main concept of the proposed metrology device is to induce spatial coherence in the measurement illumination only where required. More specifically, spatial coherence is induced between corresponding sets of pupil points in each of the off-axis beams 330. More specifically, a set of pupil points comprises a corresponding single pupil point in each of the off-axis beams, the set of pupil points being mutually spatially coherent, but where each pupil point is incoherent with respect to all other pupil points in the same beam. By optimizing the coherence of the measurement illumination in this manner, it becomes feasible to perform dark-field off-axis illumination on small pitch targets, but with minimal speckle artifacts as each off-axis beam 330 is spatially incoherent.

Once a lithographic pattern is exposed, it is etched to etch the pattern (having been exposed in resist) into the wafer. For some devices which comprise thick stacks, such as particular memory devices (e.g., 3D NAND), it is necessary to etch deep trenches (i.e., trenches having a high aspect ratio).

A problem with these trenches, once etched, is that they may not be uniform along the length of the trench. These trench non-uniformities may have negative effect on their function. Therefore it is desirable to measure these trenches subsequent to etching (i.e., after etch inspection AEI of the deep trenches) so as to obtain a measure of the trench non-uniformities (e.g., according to a homogeneity metric). Presently, no such measurement is made and therefore there is no known method for doing so.

To address this issue, it is proposed herein to obtain at least one image of a trench after-etch and determine at least one homogeneity metric (or non-homogeneity metric) therefrom. The homogeneity metric may describe or relate to one or both of:
  one or more symmetrical variation metrics along the trench (e.g., critical dimension CD); and
  one or more asymmetrical variation metrics along the trench (e.g., side wall angle SWA).

The image may be obtained from any image forming metrology tool. An image, for example, may comprise a spatial representation of one or more parameters of radiation as captured by a detector or camera (e.g., intensity/amplitude and/or phase representation) following scattering and/or diffraction from an etched trench. A scanning electron microscope SEM may be used; however SEM measurements are slow, so the use of an SEM tool is undesirable.

Any image based scatterometer or microcopy tool may be used, for example the scatterometer device illustrated in FIG. 3. Alternatively, an optimized coherence metrology tool such as illustrated in FIG. 4 may be used. Such tools can perform measurements much faster, such that the monitoring may be performed (e.g., regularly) during high volume manufacturing, possibly as part of a control loop which controls one or both of the lithographic apparatus (scanner) and the etch tool (etcher) so as to improve homogeneity.

The measurement images may comprise dark-field images and/or bright-field images. In a dark-field setting, the homogeneity metric may be measured from an image of one or more diffraction orders having diffracted from the trench being measured. An image of a single diffraction order will only yield information regarding symmetrical homogeneity (e.g., CD homogeneity or CD variation along the length of the trench). Therefore, in an embodiment, two complementary diffraction orders resulting from scattering from the etched trench may be imaged (e.g., the +1 and −1 order), and a difference "image" calculated (this may be represented or determined as an actual image or an array of (e.g., intensity and/or phase) values). This difference image will yield asymmetric homogeneity information such as SWA homogeneity or SWA variation along the length of the trench. In this manner, at least two separate homogeneity metrics (e.g., symmetric and asymmetric) may be distinguished and separately determined. Where the measurement is a bright-field measurement, an image of the zeroth order or including zeroth order information may be used in determining the homogeneity metric(s).

Where the metrology tool has a small measurement spot (or can form a small measurement spot), such that it is smaller than the trench being measured, a raster scan may be performed to form an "image", with such a small spot.

In an embodiment, the homogeneity metric measurements may be used as part of a control loop, e.g., a feedback control loop. Based on the homogeneity metric, corrections for any one or more processes which affect the trench formation may be determined and applied to the appropriate tool. For example, the corrections may be fed back to the etcher to correct the etch step, and/or fed back to the scanner to correct the exposure step. A co-optimized correction for etcher and scanner may be determined. Where there are two separate homogeneity metrics (e.g., as described above), they may be used separately; e.g., to correct different processes or aspects of one or more of the processes more relevant to its respective homogeneity metric (e.g., where one etch parameter or scanner parameter has a greater effect on SWA, the SWA or asymmetric homogeneity metric may be used to determine a correction for this etch/scanner parameter; and similarly with CD or symmetric homogeneity metric. Alternatively, the two (or more) metrics may be used together to determine a correction. For example a weighting may be applied to the different metrics in determining a correction.

Extraction of the one or more homogeneity metrics from the image(s) can be performed using standard techniques. In one example, for example, the image may be transformed (e.g., a fast Fourier transform FFT or other suitable transform) and a width (e.g., full width half maximum FWHM) of the central peak of the transform/FFT determined. Another example may comprise contouring the image (i.e., find lines of equal intensity "height") and measuring the width of the trench as a function of the length based on one or more of these contours. Such an approach is similar to contouring techniques/algorithms employed, for example, in CD-SEM measurements.

Figure 5A:
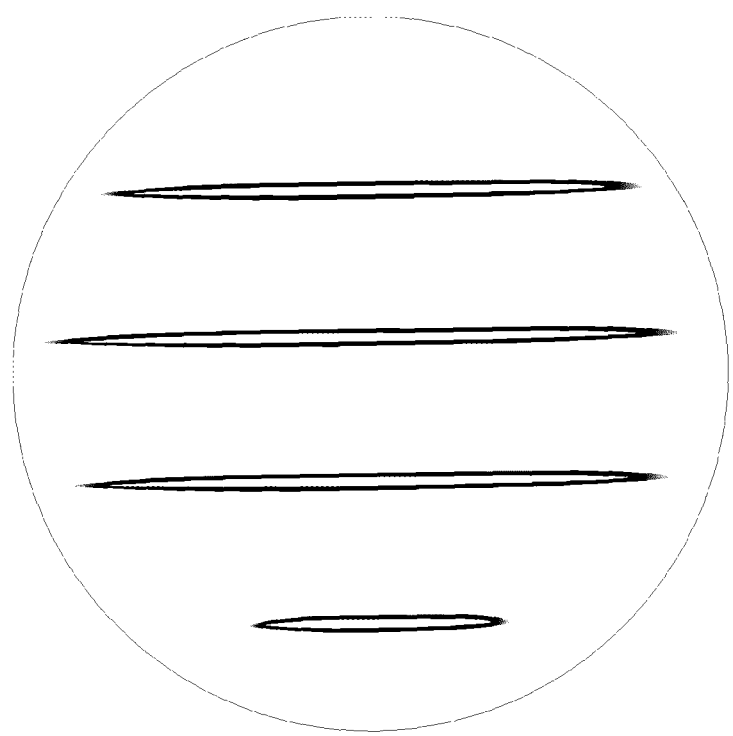
FIG. 5A shows an image of a diffraction order from a deep trench etched in a hardmask and FIG. 5B shows an image of a diffraction order from a deep trench etched in a thick stack.
Figure 5B:
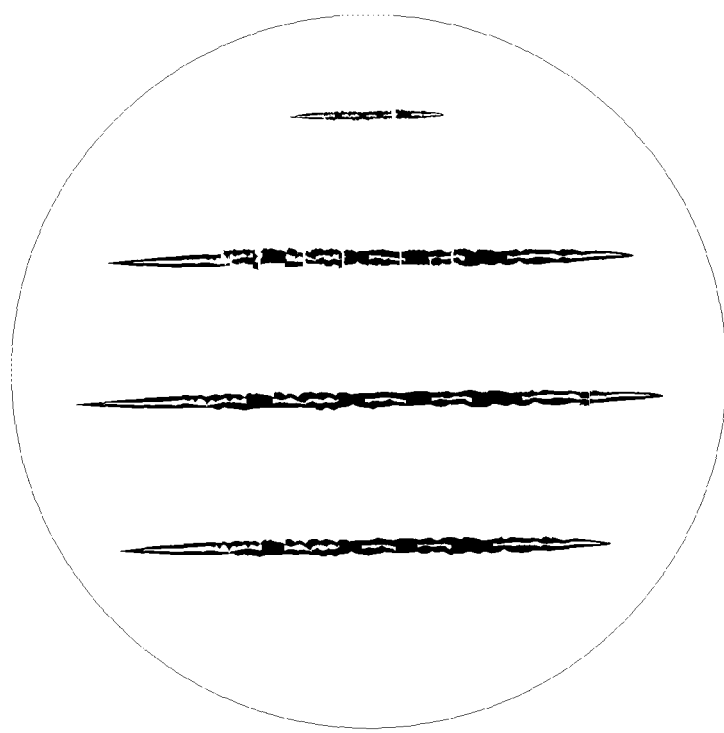

FIG. 5 comprises typical images of a single diffraction order which helps illustrate the proposed method. FIG. 5(a) comprises an image of a deep trench etched in a hardmask. In the hardmask etch, the etch variation is limited. FIG. 5(b) comprises an image after etch in a thick stack. Compared to the image of FIG. 5(a), increased variation or non-homogeneity along the etch direction (i.e. along the imaged lines) is clearly visible.

Figure 6:
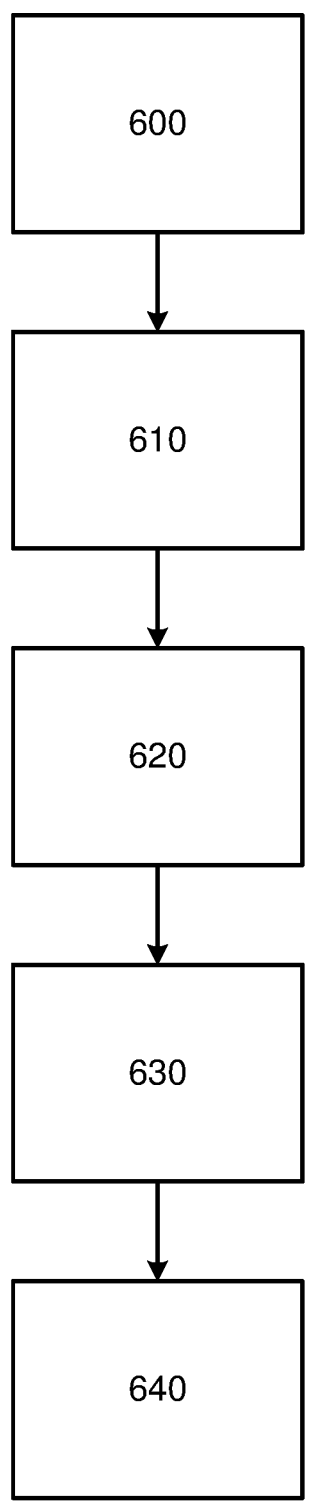
FIG. 6 is a flowchart describing a method according to an embodiment of the invention.

FIG. 6 is a flowchart describing a method according to an embodiment. At step 600, a measurement is performed on one or more of the trenches as etched in the stack to obtain one or more images of the trench (e.g., from one or more diffraction orders or otherwise). The measurement may be performed on the trench, with no overlapping gratings. No resist is necessarily, although the measurement may be of a trench in resist. At step 610, the one or more images of diffracted orders may be processed, e.g., to obtain an asymmetry image. Symmetric information may be obtained from a single diffraction order or a suitable combination of two or more orders (e.g., a sum or average). At step 620, one or more homogeneity metrics are determined from the image(s), which quantify the quality of the etched trench. This step may comprise performing an FFT on the image(s) and obtaining a value from a suitable metric of the FFT such as a width or FWHM of the central peak of the transform. Alternatively, or in addition, this step may comprise contouring the image(s) to determine lines or contours of equal intensity in the image(s) and determining the homogeneity metric from these contours. At step 630, a correction is determined for correcting one or more control parameters relating to the trench formation (e.g., a scanner or etch parameter). This may be done for each wafer or each group of wafers (e.g., per lot), for example. At step 640, the correction is used in the formation of a trench for a subsequent wafer or wafer lot, so as to improve homogeneity of the trench.

While specific embodiments of the invention have been described above, it will be appreciated that the invention may be practiced otherwise than as described.

Further embodiments according to the invention are presented in below numbered clauses:

1. A method of determining at least one homogeneity metric describing homogeneity of an etched trench on a substrate formed by a lithographic manufacturing process, the method comprising: obtaining one or more images of the etched trench, wherein each of said one or more images comprises a spatial representation of one or more parameters of scattered radiation as detected by a detector or camera following scattering and/or diffraction from the etched trench; and measuring homogeneity along the length of the etched trench on said one or more images to determine said at least one homogeneity metric.

2. A method according to clause 1, wherein said one or more images comprises an image from at least one diffraction order of radiation diffracted from the etched trench.

3. A method according to clause 1 or 2, wherein said one or more images comprises at least one dark-field image formed by said scattered radiation not comprising the zeroth order of said scattered radiation.

4. A method according to any preceding clause, wherein said one or more images comprises at least one bright-field image formed by said scattered radiation comprising the zeroth order of said scattered radiation.

5. A method according to any preceding clause, wherein said one or more images comprises at least one scatterometer or microscopy image.

6. A method according to any preceding clause, wherein said one or more images comprises at least one image comprising predominately or only information relating to symmetrical homogeneity along said etched trench; and said step of measuring homogeneity comprises measuring said measuring symmetrical homogeneity to determine at least one symmetrical variation metric.

7. A method according to clause 6, wherein said measuring symmetrical homogeneity comprises measuring critical dimension homogeneity.

8. A method according to clause 6 or 7, wherein said at least one image comprising predominately or only information relating to symmetrical homogeneity comprises an image of a single diffraction order of said scattered radiation, or a sum or average of a plurality of images, each relating to a respective single diffraction order of said scattered radiation.

9. A method according to any preceding clause, wherein said one or more images comprises at least one image comprising predominately or only information relating to asymmetrical homogeneity along said etched trench; and said step of measuring homogeneity comprises measuring said measuring asymmetrical homogeneity to determine at least one asymmetrical variation metric.

10. A method according to clause 9, wherein said measuring asymmetrical homogeneity comprises measuring side wall angle homogeneity.

11. A method according to clause 9 or 10, wherein said at least one image comprising predominately or only information relating to asymmetrical homogeneity comprises a difference or comparison image obtained from a difference or comparison of each of a pair of complementary diffraction orders of said scattered radiation.

12. A method according to any preceding clause, wherein said measuring homogeneity step comprises transforming each of said one or more images to obtain one or more respective transformed spectra; and
   determine said at least one homogeneity metric from a width of a central peak of each of said transformed spectra.

13. A method according to clause 12, wherein said transform comprises a Fourier transform of Fast Fourier transform.

14. A method according to any preceding clause, wherein said measuring homogeneity step comprises contouring each of said one or more images to determine contours of equal intensity and measuring the width of the trench as a function of the length based on the one or more of these contours.

15. A method according to any preceding clause, comprising determining at least one correction for any one or more processes relating to forming of said etched trench based said at least one homogeneity metric.

16. A method according to clause 15, comprising applying said at least one correction to correct a manufacturing process for a subsequent lithographic manufacturing process.

17. A method according to clause 16, wherein said manufacturing process comprises a 3D integrated circuit manufacturing process.

18. A method according to clause 15, 16 or 17, wherein said at least one correction comprises one or both of:
   an exposure correction relating to exposure of a pattern for forming the trench prior to etching; and
   an etch correction relating to etching of the trench to obtain the etched trench.

19. A method according to any preceding clause, comprising measuring said etched trench to obtain said one or more images.

20. A computer program comprising program instructions operable to perform the method of any preceding clause, when run on a suitable apparatus.

21. A non-transient computer program carrier comprising the computer program of clause 20.

22. A processing arrangement comprising:
   the non-transient computer program carrier of clause 21; and
   a processor operable to run said computer program.

23. A metrology device comprising the processing arrangement of clause 22.

24. A lithographic manufacturing system comprising:
   the metrology device of clause 23; and
   one or both of a:
   lithographic exposure apparatus; and
   an etch apparatus.

25. A lithographic manufacturing system according to clause 24 wherein the lithographic exposure apparatus and/or the etch apparatus is operable to form at least said etched trench on a substrate in accordance with at least one correction determined from said at least one homogeneity metric as determined using said metrology device.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A method comprising:
   obtaining one or more images of an etched trench on a substrate formed by a lithographic manufacturing process, wherein each of the one or more images comprises a spatial representation of one or more parameters of scattered radiation as detected by a detector or camera following scattering and/or diffraction from the etched trench;
   measuring homogeneity along a length of the etched trench on the one or more images to determine at least one symmetrical variation metric and at least one asymmetrical variation metric describing homogeneity of the etched trench;

determining a first correction for a first control parameter relating to a first process of the lithographic manufacturing process based on the at least one symmetrical variation metric; and determining a second correction for a second control parameter relating to a second process of the lithographic manufacturing process based on the at least one asymmetrical variation metric, wherein the first process is different than the second process.

2. The method of claim 1, wherein the one or more images comprises an image from at least one diffraction order of radiation diffracted from the etched trench.

3. The method of claim 1, wherein the one or more images comprises at least one dark-field image formed by the scattered radiation not comprising a zeroth order of the scattered radiation.

4. The method of claim 1, wherein the one or more images comprises at least one bright-field image formed by the scattered radiation comprising a zeroth order of the scattered radiation.

5. The method of claim 1, wherein the one or more images comprises at least one scatterometer or microscopy image.

6. The method of claim 1, wherein:
the one or more images comprises at least one image comprising predominately or only information relating to symmetrical homogeneity along the etched trench; and the measuring homogeneity comprises measuring the symmetrical homogeneity to determine the at least one symmetrical variation metric.

7. The method of claim 6, wherein the measuring the symmetrical homogeneity comprises measuring critical dimension homogeneity.

8. The method of claim 6, wherein the at least one image comprising predominately or only information relating to the symmetrical homogeneity comprises an image of a single diffraction order of the scattered radiation, or a sum or average of a plurality of images, each relating to a respective single diffraction order of the scattered radiation.

9. The method of claim 6, wherein:
the one or more images comprises at least one image comprising predominately or only information relating to asymmetrical homogeneity along the etched trench; and the measuring homogeneity comprises measuring the asymmetrical homogeneity to determine the at least one asymmetrical variation metric.

10. The method of claim 9, wherein the measuring the asymmetrical homogeneity comprises measuring side wall angle homogeneity.

11. The method of claim 9, wherein the at least one image comprising predominately or only information relating to the asymmetrical homogeneity comprises a difference or comparison image obtained from a difference or comparison of each of a pair of complementary diffraction orders of the scattered radiation.

12. The method of claim 1, wherein:
the measuring homogeneity comprises transforming each of the one or more images to obtain one or more respective transformed spectra; and the at least one symmetrical variation metric or the at least one asymmetrical variation metric is determined from a width of a central peak of each of the transformed spectra.

13. The method of claim 12, wherein the transforming comprises a Fourier transform of Fast Fourier transform.

14. The method of claim 1, wherein the measuring homogeneity comprises contouring each of the one or more images to determine contours of equal intensity and measuring the width of the etched trench as a function of the length based on the one or more of these contours.

15. The method of claim 1, wherein the at least one symmetrical variation metric has a greater effect on the first process compared to the at least one asymmetrical variation metric.

* * * * *